(12) United States Patent
Kattelus et al.

(10) Patent No.: US 11,548,779 B2
(45) Date of Patent: Jan. 10, 2023

(54) CAPACITIVE MICRO STRUCTURE

(71) Applicant: Teknologian Tutkimuskeskus VTT Oy, Espoo (FI)

(72) Inventors: Hannu Kattelus, Vtt (FI); Tauno Vähä-Heikkilä, Vtt (FI)

(73) Assignee: Teknologian Tutkimuskeskus VTT Oy, Espoo (FI)

( * ) Notice: Subject to any disclaimer, the term of this patent is extended or adjusted under 35 U.S.C. 154(b) by 156 days.

(21) Appl. No.: 16/624,181

(22) PCT Filed: Jun. 15, 2018

(86) PCT No.: PCT/FI2018/050467
§ 371 (c)(1),
(2) Date: Dec. 18, 2019

(87) PCT Pub. No.: WO2018/234629
PCT Pub. Date: Dec. 27, 2018

(65) Prior Publication Data
US 2020/0180943 A1   Jun. 11, 2020

(30) Foreign Application Priority Data
Jun. 19, 2017   (FI) ..................................... 20175571

(51) Int. Cl.
*B81B 3/00* (2006.01)
*B81C 1/00* (2006.01)
*H01L 49/02* (2006.01)

(52) U.S. Cl.
CPC ........ *B81B 3/0086* (2013.01); *B81C 1/00698* (2013.01); *H01L 28/60* (2013.01);
(Continued)

(58) Field of Classification Search
CPC .............................................. B81B 2201/0221
See application file for complete search history.

(56) References Cited

U.S. PATENT DOCUMENTS 6,180,976 B1    1/2001  Roy
10,266,398 B1 * 4/2019  Kubena ................. B81B 3/0078
(Continued)

FOREIGN PATENT DOCUMENTS

CN    1531063 A  *  9/2004
EP    1119012 A2    7/2001
(Continued)

OTHER PUBLICATIONS

Finnish Patent and Registration Office, Search Report, Application No. 20175571, dated Oct. 17, 2017, 2 pages.
(Continued)

*Primary Examiner* — Moazzam Hossain
(74) *Attorney, Agent, or Firm* — Ziegler IP Law Group, LLC

(57) ABSTRACT

A micro structure with a substrate having a top surface; a first electrode with a horizontal orientation parallel to the top surface of the substrate, wherein the first electrode is embedded within the substrate so that a top surface of the first electrode coincides with the top surface of the substrate; a dielectric layer arranged on the top surface of the first electrode; and a second electrode arranged above the dielectric layer.

15 Claims, 2 Drawing Sheets

(52) U.S. Cl.
CPC . *B81B 2201/016* (2013.01); *B81B 2201/0221* (2013.01); *B81B 2203/04* (2013.01); *B81C 2201/016* (2013.01); *B81C 2201/0176* (2013.01)

(56) References Cited

U.S. PATENT DOCUMENTS

| | | | |
|---|---|---|---|
| 2004/0181630 A1 | 9/2004 | Jaiprakash et al. | |
| 2007/0134835 A1 | 6/2007 | Fukuda et al. | |
| 2007/0216027 A1* | 9/2007 | Okamura | H01L 23/5223 257/737 |
| 2011/0063773 A1 | 3/2011 | Ikehashi | |
| 2011/0063774 A1* | 3/2011 | Ikehashi | H01G 5/011 361/281 |
| 2013/0168783 A1 | 7/2013 | Ding et al. | |
| 2015/0116893 A1* | 4/2015 | Hanihara | B81B 3/001 361/290 |
| 2016/0268052 A1 | 9/2016 | Gando et al. | |
| 2016/0297677 A1* | 10/2016 | Huffman | H01G 5/16 |
| 2017/0165715 A1* | 6/2017 | Sudol | G01N 29/262 |
| 2017/0183219 A1* | 6/2017 | Akiba | H02N 1/008 |
| 2018/0188127 A1* | 7/2018 | Ermolov | B81C 1/00182 |

FOREIGN PATENT DOCUMENTS

| | | |
|---|---|---|
| EP | 2061056 A2 | 5/2009 |
| EP | 2506282 A1 | 10/2012 |
| JP | 2008147368 A | 6/2008 |
| JP | 2011066150 A | 3/2011 |
| JP | 2014525665 A | 9/2014 |
| WO | 2008010436 A1 | 1/2008 |
| WO | 2013033526 A2 | 3/2013 |

OTHER PUBLICATIONS

International Search Report and Written Opinion of the International Searching Authority, Application No. PCT/FI2018/050467, dated Aug. 24, 2018, 13 pages.
Japan Patent Office, Notification of ground of rejection, Application No. 2020-519183, dated Apr. 26, 2022, 5 pages, English Translation attached, 5 pages.

* cited by examiner

CAPACITIVE MICRO STRUCTURE

TECHNICAL FIELD

The present application generally relates to micro structures, fabrication techniques and to a semiconductor apparatus. In particular, but not exclusively, the present application relates to microelectromechanical system (MEMS) structures, integrated passive devices (IPD), switched capacitors, metal-insulator-metal (MIM) capacitors and microelectromechanical system (MEMS) switches.

BACKGROUND

This section illustrates useful background information without admission of any technique described herein being representative of the state of the art.

Components fabricated with the technologies of microelectromechanical systems (MEMS) are being incorporated in an increasing number of consumer applications including, but not limited to, automotive electronics, medical equipment, smart phones, hard disk drives, computer peripherals, and wireless devices. MEMS technology is directed at forming miniaturized electromechanical devices and structures using micro-fabrication techniques. MEMS devices have typically some form of mechanical functionality that is typically in the form of a least one moving structure. Structures may be formed on a suitable substrate by a series of processing steps involving thin film depositions that are photolithographically masked and etched. MEMS mechanical elements, sensors, and actuators may be integrated on a common substrate with complementary metal-oxide-semiconductor (CMOS) devices, for example.

Integrated passive devices (IPD) technology is a way for realizing high quality factor (Q) passives in low loss substrates. Combining most of passive components to IPD and then integrating IPD based module to sub-system enables high performance, high integration density and lower assembly cost. Especially RF front-end modules and components requiring high-Q inductors are beneficial to integrate to IPD such as baluns, couplers, filters, LC resonators and matching circuits In known solutions, micro structures, such as microelectromechanical system (MEMS) metallizations are grown on top of wafers. This limits thickness of a bottom electrode typically to less than 2 µm. Known solutions also have resistive losses.

It is the aim of the current aspects of the disclosed embodiments to provide a method, structure and apparatus that mitigates for example the above problems of the state of the art.

SUMMARY

Various aspects of examples of the disclosed embodiments are set out in the claims.

According to a first example aspect of the present disclosure, there is provided a micro structure comprising:

a substrate having a top surface;

a first electrode with a horizontal orientation parallel to the top surface of the substrate, wherein the first electrode is embedded within the substrate so that a top surface of the first electrode coincides with the top surface of the substrate;

a dielectric layer arranged on the top surface of the first electrode; and a second electrode arranged above the dielectric layer.

In an embodiment, the top surface of the first electrode is polished.

In an embodiment, thickness of the first electrode is more than 5 µm.

In an embodiment, the micro structure comprises a microelectromechanical system (MEMS) switch, and further comprises:

a structural layer having a beam structure in which both ends thereof are fixed to the substrate, and the structural layer comprises the second electrode provided on a surface of the structural layer facing the substrate.

In an embodiment, the micro structure further comprises:

a lower drive electrode provided below the structural layer and an upper drive electrode provided on the surface of the structural layer facing the substrate, wherein when a potential difference is arranged between the upper drive electrode and the lower drive electrode, the structural layer is attracted towards the substrate by an electrostatic attractive force, so that the second electrode operating as an upper switch electrode and the first electrode operating as a lower switch electrode come in contact with each other.

In an embodiment, the micro structure comprises a metal-insulator-metal (MIM) capacitor, wherein the second electrode is arranged on a top surface of the dielectric layer.

In an embodiment, a first horizontal end of the top surface of the first electrode is left uncovered by the dielectric layer and the dielectric layer extends over a second horizontal end of the top surface of the first electrode.

In an embodiment, a first horizontal end of the top surface of the dielectric layer is left uncovered by the second electrode and the second electrode extends to a second horizontal end of the top surface of the dielectric layer.

In an embodiment, the micro structure further comprises a connecting element arranged on the substrate and configured to provide at least one of the following:

a first connecting element configured to provide connection to the first horizontal end of the top surface of the first electrode; and a second connecting element configured to provide connection to a second horizontal end of the second electrode adjacent to the second horizontal end of the top surface of the the of the dielectric layer.

According to a second example aspect of the present disclosure, there is provided a method of forming a micro structure, the method comprises:

providing a substrate having a top surface;

forming a first electrode with a horizontal orientation parallel to the top surface of the substrate, wherein the first electrode is embedded within the substrate so that a top surface of the first electrode coincides with the top surface of the substrate;

forming a dielectric layer on the top surface of the first electrode; and forming a second electrode above the dielectric layer.

According to a third example aspect of the present disclosure, there is provided a semiconductor apparatus comprising the micro structure according to the first aspect.

In an embodiment, the semiconductor apparatus comprises an integrated passive device (IPD).

In an embodiment, the semiconductor apparatus comprises a passivation layer arranged between the silicon substrate layer and a first metal layer.

In an embodiment, the semiconductor apparatus comprises at least one barrier layer extending on a surface of at least one metal layer of at least one electrode.

In an embodiment, the dielectric layer comprises an Atomic Layer Deposition (ALD) grown aluminum oxide layer.

In an embodiment, the dielectric layer comprises a plasma enhanced chemical vapor deposition (PECVD) layer.

Different non-binding example aspects and embodiments of the present disclosure have been illustrated in the foregoing. The embodiments in the foregoing are used merely to explain selected aspects or steps that may be utilized in implementations of the present disclosure. Some embodiments may be presented only with reference to certain example aspects of the present disclosure. It should be appreciated that corresponding embodiments may apply to other example aspects as well.

BRIEF DESCRIPTION OF THE DRAWINGS

For a more complete understanding of example embodiments of the present disclosure, reference is now made to the following descriptions taken in connection with the accompanying drawings in which.

DETAILED DESCRIPTION OF THE DRAWINGS

In embodiments, it is disclosed micro structures, such as microelectromechanical system (MEMS) switches, metal-insulator-metal (MIM) capacitors or passive components and circuits realized using inductors and capacitors. The integrated passive device (IPD) technology can also be used as an integration platform for multi-chip modules technology with hybrid integrated active circuits, for example.

The micro structure technology or integrated passive device (IPD) technology can be manufactured to any substrate that is suitable for thin film processing in clean rooms. Fused silica, quartz or high resistivity silicon are typically used for RF applications due to their good RF properties.

The micro structure or integrated passive device (IPD) layers can also be post processed to active device wafers such as CMOS, SiGe or GaAs in order to have high Q passives and re-distribution layers (RDL).

The present disclosure and its potential advantages are understood by referring to FIGS. 1 through 4 of the drawings. In this document, like reference signs denote like parts or steps.

Figure 1:
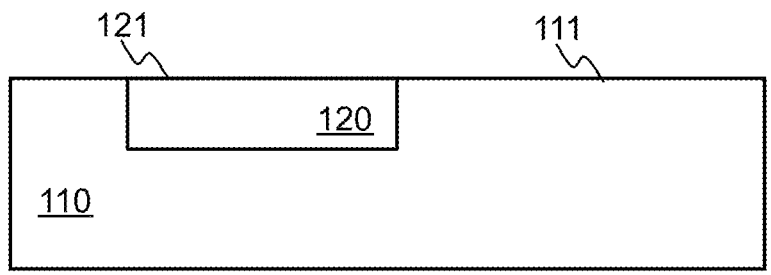
FIG. 1 illustrates profile/side view of a portion of a micro structure according to an embodiment of the present disclosure.

FIG. 1 illustrates profile/side view of a portion of a micro structure 100 according to an embodiment of the present disclosure.

In an embodiment, die (not shown) may be coupled on top of the micro structure 100. Furthermore, a circuit board (not shown) may be coupled on top or below of the micro structure 100. A solder ball may be utilized for coupling.

The micro structure 100 comprises a substrate 110 having a top surface 111, a first electrode 120 with a horizontal orientation parallel to the top surface 111 of the substrate 110, wherein the first electrode 120 is embedded within the substrate 110 so that a top surface 121 of the first electrode 120 coincides with the top surface 111 of the substrate 110.

In an embodiment, the top surface 121 of the first electrode 120 is polished or planarized to result with smooth top surface.

Vertical thickness of the first electrode 120 may be more than 5 μm, even more than 10 μm.

Figure 2:
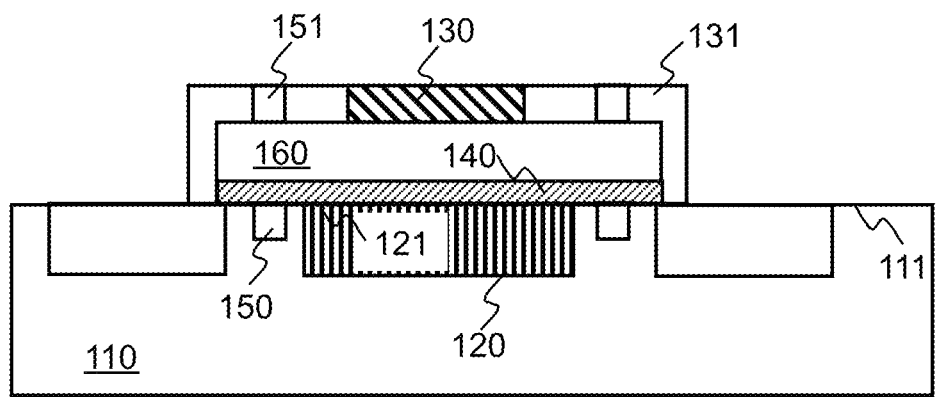
FIG. 2 illustrates a micro structure of a MEMS switch according to an embodiment of the present disclosure.

FIG. 2 illustrates a micro structure 200 of a microelectromechanical system (MEMS) switch according to an embodiment of the present disclosure.

In an embodiment, the micro structure 200 of the microelectromechanical system (MEMS) switch comprises a substrate 110 having a top surface 111, a first electrode 120 with a horizontal orientation parallel to the top surface 111 of the substrate 110, wherein the first electrode 120 is embedded within the substrate 110 so that a top surface 121 of the first electrode 120 coincides with the top surface 111 of the substrate 110.

The micro structure 200 further comprises a dielectric layer 140 arranged on the top surface 121 of the first electrode 120, and a second electrode 130 arranged above the dielectric layer 140.

In an embodiment, the micro structure 200 further comprises a structural layer 131 that has a beam structure in which both ends thereof are fixed to the substrate 110, and the structural layer 131 comprises the second electrode 130 provided on a surface of the structural layer 131 facing the substrate 110.

In an embodiment, the micro structure 200 may further comprise at least one lower drive electrode 150 provided below the structural layer 131 and at least one upper drive electrode 151 provided on the surface of the structural layer 131 facing the substrate 110. Thus, when a potential difference is arranged between the upper drive electrode 151 and the lower drive electrode 150, the structural layer 131 is attracted towards the substrate 110 by an electrostatic attractive force, so that the second electrode 130 operating as an upper switch electrode and the first electrode 120 operating as a lower switch electrode come in contact with each other.

In an embodiment, the drive electrodes 150,151 may be integrated with first and second electrodes 120,130 or the first and the second electrodes 120,130 may be used to provide bias voltage for the potential difference.

Embodiments of the present disclosure enable a new type of a MEMS switch device that has thicker bottom electrode than prior known systems. This lowers the loss of the MEMS switch technology and increases the quality factor (Q) when the technology is used as switch capacitor technology. The top surface 121 of the electrode 120 metallization may be polished/planarized resulting in smooth top surface. This is important especially for MEMS components because the structural layer 131 of embodiments does not have any steps as in prior known methods. In prior known methods, if thick metals (>1 μm) are deposited on the surface of a wafer, this causes steps to the structural layer of the MEMS component and thus potentially causes problems later on. RF power handling is also improved significantly because of thick metallizations for bottom electrode especially.

Thus, higher quality factor (Q) is achieved meaning lower resistive losses together with easier post processing compared to prior known methods. Furthermore, there are no step coverage problems in the dielectric layer 140 and no steps in the structural layer 131 because of the smooth bottom electrode 120. This results in higher voltage and power handling.

In general, MEMS RF switches have performance advantages over traditional semiconductor switches. For instance, the MEMS RF switch provides extremely low insertion loss when the switch is on, and exhibits a high attenuation level when the switch is off. In contrast to semiconductor switches, the MEMS RF switch features very low power consumption and a high frequency level (approximately 70 GHz).

In an embodiment, the MEMS RF switch has a MIM (Metal/Insulator/Metal) structure, that is, an insulator/dielectric layer 140 is sandwiched between two electrodes 120,130. Therefore, when a bias voltage is applied to the MEMS RF switch (e.g. over drive electrodes 150,151 or the electrodes 120,130), the switch acts as a capacitor, allowing an AC signal to pass therethrough.

In an embodiment, FIG. 2 shows a cross-sectional view of a MEMS RF switch 200. The MEMS RF switch 300 includes a substrate 110, a first electrode 120, an insulator (dielectric layer) 140, and a second electrode 130. Particularly, the MEMS RF switch in FIG. 2 has a structural layer 131 where the second electrode 130 is arranged. Also, an air gap 160 exists between the second electrode 130 and the insulator 140.

When a bias voltage (over drive electrodes or main electrodes) is applied, at least one electrode may be thermally expanded and shifts in the direction of the insulator 140, thereby making contact with the insulator 140. As such, the first electrode 120, the insulator 140 and the second electrode 130 act as a capacitor together, and the RF switch 200 is turned on, which in turn allows an RF signal to pass therethrough at a predetermined frequency band. However, if the bias voltage is not applied, the second electrode 130 is separated from the insulator 140. As a result, the RF switch 200 is turned off and cannot allow the RF signal to pass therethrough.

In an embodiment, when the bias voltage is applied, a second bias electrode 130,151 is charged positively resulting in a buildup of positive (+) charges, and a first bias electrode 120,150 is charged negatively resulting in a buildup of (−) charges. Meanwhile, the charge on the insulator 140 may be maintained at 0, independent of the application of a bias voltage. In practice, however, charge buildup often occurs to the insulator 140. Thus, the detected charge on the insulator 140 is not always 0.

Figure 3:
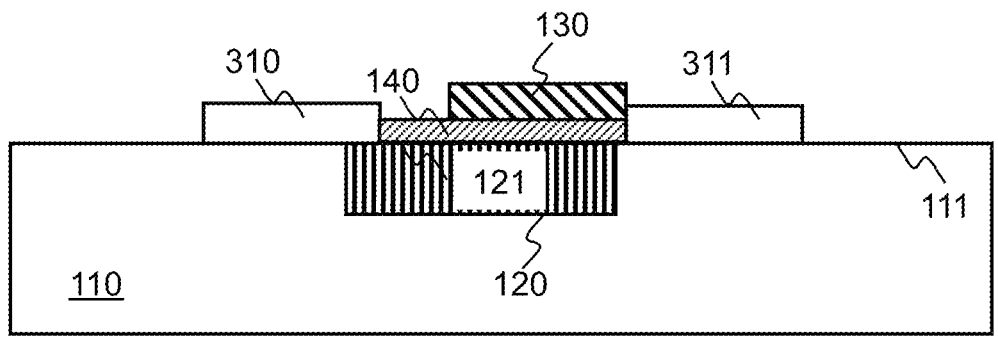
FIG. 3 illustrates a micro structure of a MIM capacitor according to an embodiment of the present disclosure.

FIG. 3 illustrates a micro structure 300 of a MIM capacitor according to an embodiment of the present disclosure.

In an embodiment, the micro structure 300 of the MIM capacitor comprises a substrate 110 having a top surface 111, a first electrode 120 with a horizontal orientation parallel to the top surface 111 of the substrate 110, wherein the first electrode 120 is embedded within the substrate 110 so that a top surface 121 of the first electrode 120 coincides with the top surface 111 of the substrate 110.

The micro structure 300 further comprises a dielectric layer 140 arranged on the top surface 121 of the first electrode 120 and a second electrode 130 arranged on a top surface of the dielectric layer 140.

In an embodiment, a first horizontal end of the top surface 121 of the first electrode 120 is left uncovered by the dielectric layer 140 and the dielectric layer 140 extends over a second horizontal end of the top surface 121 of the first electrode 120, as shown in FIG. 3.

Furthermore, a first horizontal end of the top surface of the dielectric layer 140 may be left uncovered by the second electrode 130 and the second electrode 130 may extend to a second horizontal end of the top surface of the dielectric layer 140.

In an embodiment, the micro structure 300 may further comprise at least one connecting element 151,152 arranged on the substrate 110.

A first connecting element 151 may be configured to provide connection to the first horizontal end of the top surface 121 of the first electrode 120, for example. The first connecting element 151 may be a connecting pad, for example.

A second connecting element 152 may be configured to provide connection to a second horizontal end of the second electrode 130 adjacent to the second horizontal end of the top surface of the dielectric layer 140, for example. The second connecting element 151 may also be a connecting pad, for example. The second connecting element 152 may be comprised by the second electrode 130 and form a single element 130.

The first connecting element 151 and the second connecting element 152 may be arranged in opposite horizontal ends of the top surface of the dielectric layer 140.

In known systems, the thickness of the bottom electrode of MIM capacitor is typically between 0,1 µm and 1 µm. This limits the quality factor (Q) of MIM-capacitors because of the resistive losses.

Embodiments for the MIM capacitor enable thicker (5-10 µm) bottom electrode 120. The thick bottom electrode 120 is fabricated into the substrate 110 and planarized afterwards. This allows smooth surface 121 for the next processing steps. A dielectric layer 140 is grown after the metal layer of the first electrode 120 is provided. The dielectric layer 140 can be patterned if needed. On top of dielectric layer 140, a metal layer the second electrode 130 is grown.

This multi-purpose technology is suitable for a plurality of RF applications and frequencies from Very High Frequency (VHF) to millimeter waves. The semiconductor apparatus 300 may further comprise thin film resistors, and IPD components between different metal layers, for example.

In an embodiment, at least one barrier layer may extending on a surface of at least one metal layer of electrodes 120,130 may be formed.

The barrier layer may comprise a low-pressure chemical vapor deposition nitride (LPCVD SiN) or a plasma enhanced chemical vapor deposition nitride (PECVD SiN).

The dielectric layer 140 may comprise an Atomic Layer Deposition (ALD) grown aluminum oxide layer or a plasma enhanced chemical vapor deposition (PECVD) layer, such as tetraethylorthosilicate (TEOS), for example. The substrate may comprise a silicon substrate layer 110.

In an embodiment, connecting elements 310,311 may comprise conductive pads that may be used to interconnect to at least one metal layer. Connection to an integrated passive device (IPD) of a semiconductor apparatus may also be arranged. The metal layer pads 310,311 of the semiconductor apparatus may be coupled to integrated passive device (IPD) terminals, for example.

The dielectric layer 140 may affect to the RF performance of the micro structure 300.

In an embodiment, different insulator deposition methods may be used to result different RF performances. RF performance may be optimized, for example, with a thin oxide layer 140 with minimal static charge.

In an embodiment, high resistive silicon substrates 110 may be used. Such high resistivity silicon substrates 110 with novel passivation layer(s) do not necessarily behave the same way as standard silicon wafers.

The thickness and material type of a dielectric layer 140 in contact with the micro structure substrate 110 has an effect to the performance of the micro structure 300. Especially RF performance is affected. The substrate 110 may comprise a glass or a silicon substrate in some implementations.

In an embodiment, a copper metal layer may be provided for high quality factor transmission lines and passive components, for example. Metal layers may be separated by a polyimide layer 140 and different metal layer elements of the same metal layer may be separated by a second polyimide material. As a further step, flip chip bumps may be deposited to allow component assembly to modules.

In an embodiment, SiO2 may be used as a dielectric material 140 but other materials are also available if higher capacitance densities are needed. For example, Ta2O5, HfO or ZrO2 have permittivity of 25, 16 and 20.

For IPD devices, resistance of the thin film resistor layer can be chosen according to application. For example, resistance of the standard process thin film resistors is good for matched RF terminations and resistor for resistive Wilkinson power dividers. Applications such as RF MEMS biasing circuits need resistance values preferably above 500 ohm.

Embodiments of the present disclosure enable a new type of a MIM capacitor that has thicker bottom electrode than prior known systems. This lowers the resistive loss of the MIM capacitor technology and increases the quality factor when the technology is used. The top surface 121 of the electrode 120 metallization may be polished/planarized resulting in smooth top surface. This is important especially for MIM components because the dielectric layer 140 then has no step coverage problems as in prior known systems. In prior known methods, if thick metals (>1 µm) are deposited on the surface of a wafer, this causes steps to the dielectric layer 140 to embed the first electrode 120. The MIM capacitor of the embodiments has also higher breakdown voltage compared to the traditional MIM capacitors due to the polished and smooth surface. RF power handling is also improved significantly because of thick metallizations for bottom electrode 120 especially.

Thus, higher quality factor (Q) is achieved meaning lower resistive losses together with easier post processing compared to prior known methods. Furthermore, there are no step coverage problems in the dielectric layer 140 because of the smooth bottom electrode 120. This results in higher voltage and power handling.

Figure 4:
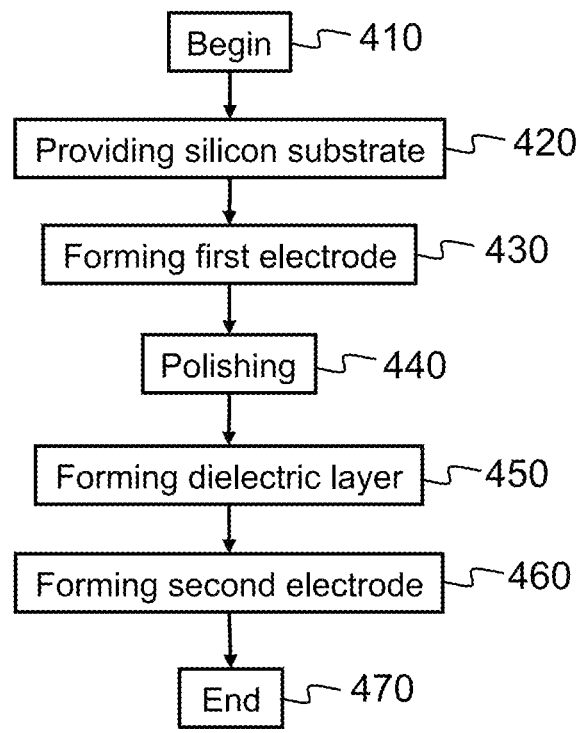
FIG. 4 shows a flow chart of a method according to an embodiment of the present disclosure.

FIG. 4 shows a flow chart of a method according to an embodiment of the present disclosure.

A method of forming a micro structure 100,200,300 (see e.g. FIGS. 1-3) is started in step 410. In step 420, a silicon substrate 110 having a top surface 111 is provided. In step 430, a first electrode 120 is formed with a horizontal orientation parallel to the top surface 111 of the substrate 110, wherein the first electrode 120 is embedded within the substrate 110 so that a top surface 121 of the first electrode 120 coincides with the top surface 111 of the substrate 110. In step 440, a top surface of the first electrode 120 is polished/polarized. In step 450, a dielectric layer 140 is formed on the top surface 121 of the first electrode 120. In step 460, a second electrode 130 is formed above the dielectric layer 140. In step 470, the method ends.

In an embodiment, a passivating layer comprises aluminium oxide and is formed on a surface of a silicon substrate to protect from effects caused by chemical interaction between the passivating layer and a conducting electrode by fabricating a barrier layer between the passivating layer and the conducting electrode.

A barrier layer comprising titanium and oxygen, tantalum and oxygen, zirconium and oxygen, hafnium and oxygen, or a combination of any of these, or a combination of any of these with aluminium and oxygen, on the passivating layer may be deposited by exposing the passivating layer in a reaction space to alternately repeated surface reactions of two or more different precursors, wherein at least one of the precursors is a precursor for oxygen, and forming the conducting electrode on the barrier layer deposited on the passivating layer by making a layer comprising aluminium paste on the barrier layer.

The reaction space may be subsequently pumped down to a pressure suitable for forming the passivating layer comprising aluminium oxide. The reaction space can be pumped down to the suitable pressure using e.g. a mechanical vacuum pump or, in the case of atmospheric pressure ALD systems and/or processes, gas flows can be set to protect the deposition zone from the atmosphere. The silicon substrate may be also heated to a temperature suitable for forming the passivating layer, the conductive layer or the dielectric layer by the used method. The silicon substrate can be introduced to the reaction space through e.g. an airtight load-lock system or simply through a loading hatch. The silicon substrate can be heated by e.g. resistive heating elements that also heat the entire reaction space.

After the silicon substrate and the reaction space have reached the targeted temperature and other conditions suitable for deposition, the silicon surface can be conditioned such that the deposited material may be essentially directly deposited on the silicon surface. This conditioning of the silicon surface on which the layer is to be deposited can include chemical purification of the surface of the silicon film from impurities and/or oxidation. Especially removal of oxide is beneficial when the silicon surface has been imported into the reaction space via an oxidizing environment, e.g. when transporting the exposed silicon surface from one deposition tool to another. The details of the process for removing impurities and/or oxide from the surface of the silicon film will be obvious to the skilled person in view of this specification. In some embodiments of the present disclosure the conditioning can be done ex-situ, i.e. outside the tool suitable for ALD-type processes.

After the silicon substrate has been conditioned, an alternate exposure of the deposition surface to different precursor chemicals may be started, to form a further layer directly on the silicon substrate. Each exposure of the deposition surface to a precursor results in the formation of additional deposit on the deposition surface, as a result of adsorption reactions of the corresponding precursor with the deposition surface.

A typical reactor suitable for ALD-type deposition comprises a system for introducing carrier gas, such as nitrogen or argon into the reaction space such that the reaction space can be purged from surplus chemical and reaction by-products before introducing the next precursor chemical into the reaction space. This feature together with the controlled dosing of vaporized precursors enables alternately exposing the substrate surface to precursors without significant intermixing of different precursors in the reaction space or in other parts of the reactor. In practice the flow of carrier gas is commonly continuous through the reaction space throughout the deposition process and only the various precursors are alternately introduced to the reaction space with the carrier gas.

Thickness of a further optional layer, e.g. a passivation layer, on the silicon substrate can be controlled by the number of exposures of the deposition surface to the different precursors. The thickness of the passivating layer is increased until a targeted thickness is reached, after which the at least one insulator layer is deposited.

Deposition of an insulator layer, e.g. a dielectric layer, in one embodiment of the present disclosure, is carried out in an ALD-type process in the same deposition tool. In this case deposition of the insulator layer can begin simply by changing the precursor chemicals from those used for the deposition of the previous layer to those suitable for the deposition of the insulator layer.

In an embodiment, a bond wire package includes a micro structure 100,200,300 stacked on a die. The die may be disposed on a leadframe. The leadframe may be a pin grid array (PGA) package, a quad flat non-leaded (QFN) package or other package. The leadframe may comprise first pads and may be mounted on a PCB. An intermediate layer may be disposed between the micro structure 100,200,300 and the die and connect the micro structure 100,200,300 to the die. Integrated passive devices (IPD) may also be arranged within the die.

The integrated passive device (IPD) includes an insulation layer or a second substrate, and the metallization layers. The insulation layer or the second substrate is disposed between the metallization layers. The insulation layer or the second substrate may include vias. The vias may be through glass vias (TGVs) or through silicon vias (TSVs). The vias may connect the first metallization layer and/or passive devices on the first metallization layer to the second metallization layer and/or passive devices on the second metallization layer. Each of the passive devices may be implemented on one or more layers of the integrated passive device (IPD).

Additional pads may be disposed on the micro structure 100,200,300. The pads may be connected to the first pads by bond wires. The pads may be connected to the metallization layer and/or passive devices in the metallization layer.

Without in any way limiting the scope, interpretation, or application of the claims appearing below, a technical effect of one or more of the example embodiments disclosed herein is improved RF power handling because of thick metallizations for bottom electrode especially. Another technical effect of one or more of the example embodiments disclosed herein is improved quality factor (Q). Another technical effect of one or more of the example embodiments disclosed herein is easier post processing compared to known methods. Another technical effect of one or more of the example embodiments disclosed herein is there are no step coverage problems in the dielectric layer and no steps in the structural layer because of the smooth bottom electrode. This results in higher voltage and power handling. Another technical effect of one or more of the example embodiments disclosed herein is an improved fabrication process of a micro structure. Another technical effect of one or more of the example embodiments disclosed herein is the provision of a reliable and compact semiconductor apparatus.

Although various aspects of the present disclosure are set out in the independent claims, other aspects of the present disclosure comprise other combinations of features from the described embodiments and/or the dependent claims with the features of the independent claims, and not solely the combinations explicitly set out in the claims.

It is also noted herein that while the foregoing describes example embodiments of the present disclosure, these descriptions should not be viewed in a limiting sense. Rather, there are several variations and modifications that may be made without departing from the scope of the present disclosure as defined in the appended claims

The invention claimed is:

1. A micro structure comprising:
   a silicon substrate having a top surface; and
   a metal-insulator-metal (MIM) capacitor comprising:
      a first electrode with a horizontal orientation parallel to the top surface of the silicon substrate, wherein the first electrode is embedded within the silicon substrate so that a top surface of the first electrode coincides with the top surface of the substrate;
      a dielectric layer arranged on the top surface of the first electrode; and
      a second electrode arranged above the dielectric layer, the micro structure further comprising:
         a first connecting element arranged on the silicon substrate and configured to provide a conductive connection to a first horizontal end of the top surface of the first electrode; and
         a passivation layer formed on the silicon substrate between the silicon substrate and the first connecting element.

2. The micro structure of claim 1, wherein the top surface of the first electrode is polished.

3. The micro structure of claim 1, wherein thickness of the first electrode is more than 5 μm.

4. The micro structure of claim 1, wherein
   the second electrode is arranged directly on a top surface of the dielectric layer.

5. The micro structure of claim 4, wherein
   a first horizontal end of the top surface of the first electrode is left uncovered by the dielectric layer and the dielectric layer extends over a second horizontal end of the top surface of the first electrode.

6. The micro structure of claim 5, wherein
   a first horizontal end of the top surface of the dielectric layer is left uncovered by the second electrode and the second electrode extends to a second horizontal end of the top surface of the dielectric layer.

7. A semiconductor apparatus comprising the micro structure of claim 1.

8. The semiconductor apparatus of claim 7, further comprising an integrated passive device (IPD).

9. The semiconductor apparatus of claim 7, further comprising at least one barrier layer extending on a surface of a metal layer of the first electrode.

10. The semiconductor apparatus of claim 7, wherein the dielectric layer comprises an Atomic Layer Deposition (ALD) grown aluminum oxide layer or a plasma enhanced chemical vapor deposition (PECVD) layer.

11. The micro structure of claim 6, further comprising:
   a second connecting element arranged on the silicon substrate and configured to provide connection to a second horizontal end of the second electrode adjacent to the second horizontal end of the top surface of the of the dielectric layer.

12. The micro structure of claim 1, wherein the first connecting element comprises a metal layer pad.

13. The micro structure of claim 1, wherein the dielectric layer is made of SiO2, Ta2O5, HfO, or ZrO2.

14. The micro structure of claim 1, wherein the first electrode comprises thick metallization of >1 μm.

15. A method of forming a micro structure comprising a metal-insulator-metal (MIM) capacitor, the method comprising:
   providing a silicon substrate having a top surface;
   forming the MIM capacitor by:
      forming a first electrode with a horizontal orientation parallel to the top surface of the silicon substrate, wherein the first electrode is embedded within the silicon substrate so that a top surface of the first electrode coincides with the top surface of the silicon substrate;
      forming a dielectric layer on the top surface of the first electrode; and forming a second electrode above the dielectric layer;
the method further comprising:
forming a first connecting element on the silicon substrate, the first connecting element configured to provide a conductive connection to a first horizontal end of the top surface of the first electrode; and
forming a passivation layer on the silicon substrate between the silicon substrate and the first connecting element.

* * * * *